US008288208B1

(12) United States Patent
Liu et al.

(10) Patent No.: US 8,288,208 B1
(45) Date of Patent: Oct. 16, 2012

(54) APPARATUS AND METHODS FOR SEMICONDUCTOR PACKAGES WITH IMPROVED WARPAGE

(75) Inventors: Yu-Chih Liu, Taipei (TW); Jing Ruei Lu, Taipei (TW); Wei-Ting Lin, Taipei (TW); Sao-Ling Chiu, Hsin-Chu (TW); Chien-Kuo Chang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/192,379

(22) Filed: Jul. 27, 2011

(51) Int. Cl.
*H01L 21/44* (2006.01)
(52) U.S. Cl. .................................... 438/118; 438/122
(58) Field of Classification Search .............. 438/108, 438/118, 119, 122, 125
See application file for complete search history.

(56) References Cited

U.S. PATENT DOCUMENTS

| 7,833,839 | B1 * | 11/2010 | Touzelbaev et al. | 438/122 |
| 2001/0026957 | A1 * | 10/2001 | Atwood et al. | 438/122 |
| 2004/0150118 | A1 * | 8/2004 | Honda | 438/108 |
| 2008/0124841 | A1 * | 5/2008 | Too et al. | 438/118 |
| 2010/0020503 | A1 * | 1/2010 | Beaumier et al. | 438/118 |

OTHER PUBLICATIONS

Xiong, B., et al., "Warpage Improvement for Large Die Flip Chip Package," 2009 11th Electronics Packaging Technology Conference, IEEE, pp. 40-43.
Zhang, J., et al., "Effects of Bump Metallurgies, Underfill Material and its Cure Process on Package Warpage," 2010 11th International Conference on Electronic Packaging Technology & High Density Packaging, IEEE, pp. 330-336.
Zhang, W., et al., "The Effect of Underfill Epoxy on Warpage in Flip-Chip Assemblies," IEEE Transactions on Components, Packaging, and Manufacturing Technology—Part A, vol. 21, No. 2, Jun. 1998, pp. 323-329.

* cited by examiner

*Primary Examiner* — Kevin M Picardat
(74) *Attorney, Agent, or Firm* — Slater & Matsil, L.L.P.

(57) ABSTRACT

Methods for making a substrate for semiconductor packaging with improved warpage and an apparatus. A method includes providing on a die side of a substrate at least one flip chip mounted integrated circuit die. The substrate may include through substrate vias (TSVs). An underfill is dispensed between the integrated circuit die and the substrate. Initially the underfill is left uncured. A thermal interface material is provided on the upper surface of the at least one integrated circuit die. A heat sink is mounted over the integrated circuit die and in thermal contact with the thermal interface material. A thermal cure is performed to simultaneously cure the underfill material and the thermal interface material. In another embodiment, the thermal cure may simultaneously cure an adhesive mounting the heat sink to the substrate. Solder balls are disposed on a board surface of the substrate to form a ball grid array package.

15 Claims, 8 Drawing Sheets

APPARATUS AND METHODS FOR SEMICONDUCTOR PACKAGES WITH IMPROVED WARPAGE

BACKGROUND

A common requirement of current integrated circuit manufacturing and packaging is the use of substrates to receive single or multiple integrated circuit dies as part of a semiconductor package. The substrate may be an organic build up material, a printed circuit board, a BT resin substrate, a glass or ceramic, or even a semiconductor wafer. Recently the use of three-dimensional IC ("3DIC") packaging is increasing; and this vertically oriented approach enables stacking. Stacking of devices is done by forming vertical connections between devices. The use of through vias or through substrate vias ("TSVs") extending through the substrate interposers is increasing with the increase in 3DIC assemblies. These through vias allow electrical coupling between integrated circuit dies and components mounted on one side of a substrate, and electrical terminals such as solder balls or solder columns mounted on the opposite side.

The assembly of integrated circuit devices on substrates creates many challenges. The substrates used may be thin. The substrates are therefore subject to warpage. Substrate warp can adversely affect later processes and device yield. The warpage may lead to interfacial mechanical strain on materials in the integrated circuit dies such as low-k dielectric materials, on solder connections such as microbumps for flip chip connections, and on solder balls for board level connections. The substrate warp also results in non-uniform bump and ball conditions, for example. The strains can lead to in-field failures after the device is put into use. The substrate warp may lead to yield problems, which are yield may be lowered due to failures that cause the devices mounted on the substrates to fail prior to completing assembly of the package.

The substrate is often used to receive one or more integrated circuit dies mounted as "flip chips". The dies are oriented "face down" over a die side of the substrate. Solder connectors such as microbumps may be provided on the dies or the substrate. These connections provide an electrical coupling of bond pads on the integrated circuit dies to TSVs or electrical lands on the interposer. Thermal reflow is used to mount the flip chip integrated circuit dies to the substrates using the microbumps or other solder connections.

Because there is a coefficient of thermal expansion ("CTE") mismatch between the integrated circuit dies and the other materials at the flip chip interface, an underfill is used. The underfill relieves the thermal stress that occurs as a stress or strain on the interfacial materials. The underfill may be flowed underneath the dies and surrounds the microbumps in a liquid state, and may then be cured by the use of a thermal cycle. Package substrate warp has been observed at the flip chip bond stage, and additional package warp has been noted again after underfill cure.

The package assembly process then continues by mounting a heat sink. The heat sink is a thermally conductive shield that is mounted over and in thermal contact with the top side of the integrated circuit dies. A thermally conductive material, thermal interface material ("TIM") may be applied to the dies and the heat sink. A second thermal cycle is next performed to cure the TIM and the heat sink adhesive. Additional substrate warp has been observed following the cure of the TIM material. As the flip chip integrated circuits become larger in die area, the package warp tends to increase. Conventional approaches may fail to meet the required standards for package warp.

A continuing need thus exists for methods and apparatus to efficiently perform flip chip mounting of devices on substrates with reduced substrate warpage and reduced thermal stress, and without the problems and costs experienced when using the known methods.

BRIEF DESCRIPTION OF THE FIGURES

For a more complete understanding of the present embodiments, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments or the claims.

Embodiments of the present application which are now described in detail provide novel method embodiments for performing flip chip and heat sink mounting on interposers with reduced package warp. The embodiments require fewer steps than conventional processes and eliminate thermal cure steps over conventional approaches. The use of the embodiments results in reduced warp and reduced thermal stress and interfacial strain on the packaged devices.

The methods and apparatus embodiments are not limited to particular substrates or particular integrated circuit types and may be advantageously used to mount devices on substrates including, without limitation, flip chip dies with microbumps, solder columns and the like; and heat sinks or heat shields mounted over the dies, substrates with TSV, wire bonding, C4, solder balls, or other connections, semiconductor substrates including silicon wafers, all materials commonly used in packaging technology. The methods have particular application to substrates including TSVs but are not limited to these. The integrated circuit dies mounted on the substrates may be of any type including memory, digital processors, analog integrated circuits, RF integrated circuits; micro electro-mechanical systems ("MEMS") devices, digital light processors ("DLPs") and generally any semiconductor device, whether discrete or highly integrated, and including passive circuitry and active transistor circuitry.

Figure 1:
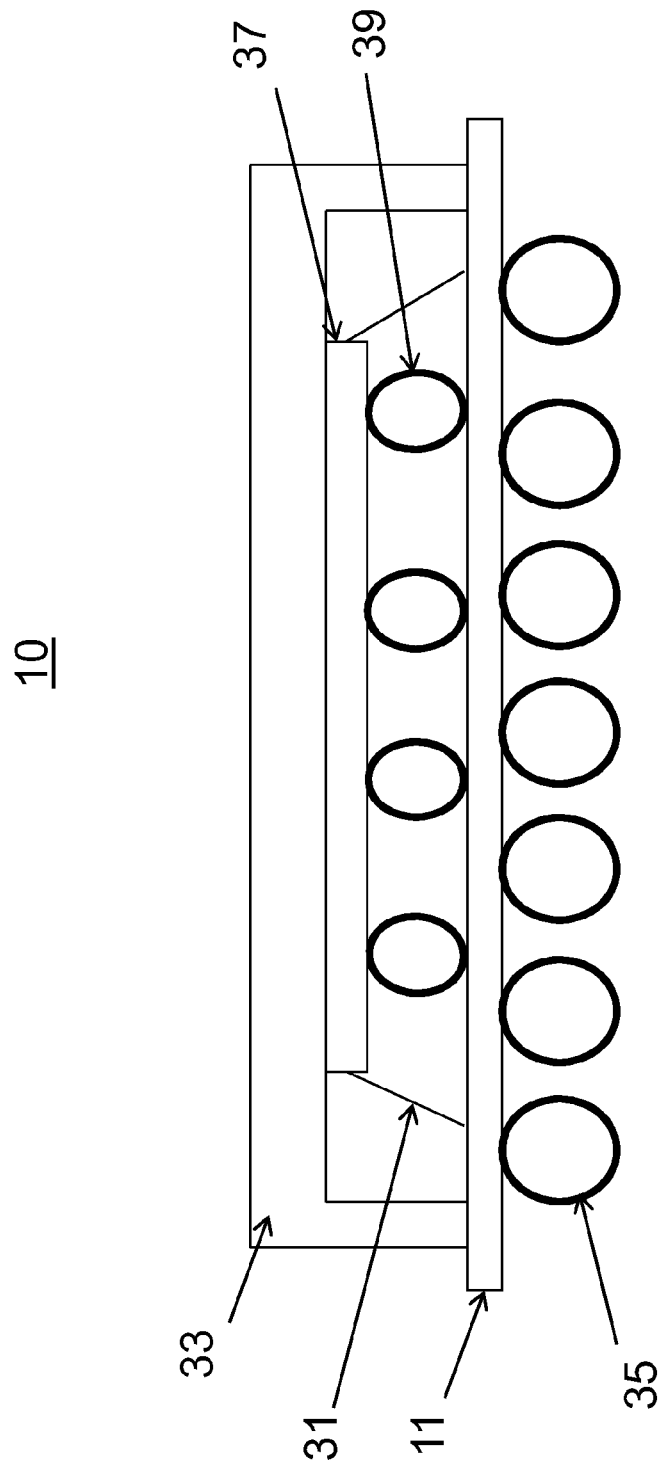
FIG. 1 depicts in a cross-section an integrated circuit package including a substrate.

FIG. 1 depicts in a cross-sectional view an example package assembly 10 which is presented solely for the use of explanation of the embodiments. FIG. 1 depicts a package 10 without visible warpage; this illustration is presented here for explanation of the components. In FIG. 1, a substrate 11 is depicted. This substrate may be, as non-limiting examples, an organic build up substrate, BT resin, PC board, or other substrate materials such as glass, alumina, or ceramic materials. The substrate can also be a semiconductor substrate. The substrate may also include TSV connections. An integrated circuit die 37 is depicted arranged face down (active surface down) and facing the top surface of the substrate 11. The integrated circuit 37 is mounted to the substrate 11 using flip chip bonding. The electrical connections between the integrated circuit 37 and the substrate 11 are formed in this example arrangement using solder connections, in this example, microbumps 39. These microbumps can be formed using solder including lead-based and lead-free eutectic materials. Solder may include copper, tin, silver, lead, nickel, and other materials. A typical lead based solder may include lead and tin. A typical lead free solder may include copper, silver, and tin. The physical and electrical connections between the integrated circuit 37 and the die side of the substrate 11 are formed by a thermal reflow of the solder connections. Note that other connections including solder columns, controlled collapsing column connectors ("C4") connectors, stud bumps, solder balls and solder bumps, may be used as alternatives to microbumps 39.

Heat sink 33 is disposed over the integrated circuit 37. The heat sink can be formed of any thermally conductive material including for example copper and its alloys, and aluminum and its alloys. A typical heat sink may be formed of copper or a copper alloy with a nickel, palladium, or platinum or alloy coating to reduce corrosion. A thermal interface material ("TIM") not shown in the figure may be disposed on the upper or back side of the integrated circuit and provide a thermally conductive path between the upper side of integrated circuit die 37 and the heat sink 33 to improve thermal removal when the integrated circuit die 37 is operating.

A characteristic of the package assembly 10 is that there is a coefficient of thermal expansion ("CTE") mismatch between the integrated circuit die 37 and the substrate 11. For example, the CTE of silicon is about 2.5 ppm/degrees Celsius, while substrate materials may have CTEs that are several times higher, such as about 7 ppm/degrees Celsius for ceramic and as much as 15 ppm/degrees Celsius for organic substrates. Thus, without some stress relief, the CTE mismatch can cause a high level of stress in the solder connectors, including cracking and pull off. Underfill materials are therefore used with flip chip mounted integrated circuits to provide the needed stress relief. These materials are often of liquid epoxy resin when applied or provided, and then typically are thermally cured at a temperature of greater than 140 degrees Celsius for some time period, perhaps 30 minutes to several hours, to cure as a hardened epoxy or resin.

An underfill material 31 is shown beneath the integrated circuit die 37 and surrounding the microbumps 39. This underfill material may be selected from many known materials and underfills may be chosen for various properties including high or low glass transition temperatures (Tg), modulus, flow rate, cure time, and the like. Snap cure and low flow underfills are available. Silica fillers may be used to make the underfill CTE more closely match the CTE properties of the solder, so that the thermal stress during thermal cycling is reduced on the solder joints. Typically, the underfill is dispensed as a liquid and may be an epoxy or resin. The underfill is electrically insulating so that shorts do not form between the solder bumps. It may be desirable to select a high Tg underfill material, particularly when lead free solder is used for microbumps 39. However, as mentioned above, the use of high Tg materials may increase the package warp that occurs during the assembly process, and so a trade-off between package warpage increase and the use of high Tg underfill is made, this trade-off is particularly difficult when the conventional approaches are used.

The underfill 31 may be dispensed in liquid form and made to flow underneath the integrated circuit die 37 by capillary action. Underfill materials for capillary dispensing are known as "CUF" or capillary underfills. Typically the substrate may be heated to increase the underfill viscosity during dispensing. Following the dispensing, a thermal cure is performed to complete the underfill layer. Thus the underfill is a cured epoxy and provides mechanical strength, stress relief, and thermal protection for the microbumps 37.

Solder balls 35 are mounted to the board side of the substrate 11 (here, the bottom side as shown) and the assembly now forms a complete a ball grid array ("BGA") package 10 for the integrated circuit die 37.

Note that while a single integrated circuit die 37 is shown for simplicity, the assembly 10 may include several integrated circuit dies. Further, these dies may be connected electrically and form a system. For example, an ASIC and a MEMS device may be provided as separate silicon dies that are packaged on a single substrate to form a System in Package ("SIP"). Further, wafer level processing ("WLP") may be used. In this approach, a plurality of integrated circuit dies 37 may be simultaneously flip chip mounted to a large substrate 11, and each may receive an underfill, a heat sink, and solder balls. The wafer level assembly may then be separated by dicing, sawing or other singulation methods to form individual packaged devices. WLP lowers costs and increases yield by economy of scale and increased throughput. In WLP certain process steps, such as thermal cures, are shared by many devices in a parallel processing approach, increasing throughput.

Figure 2:
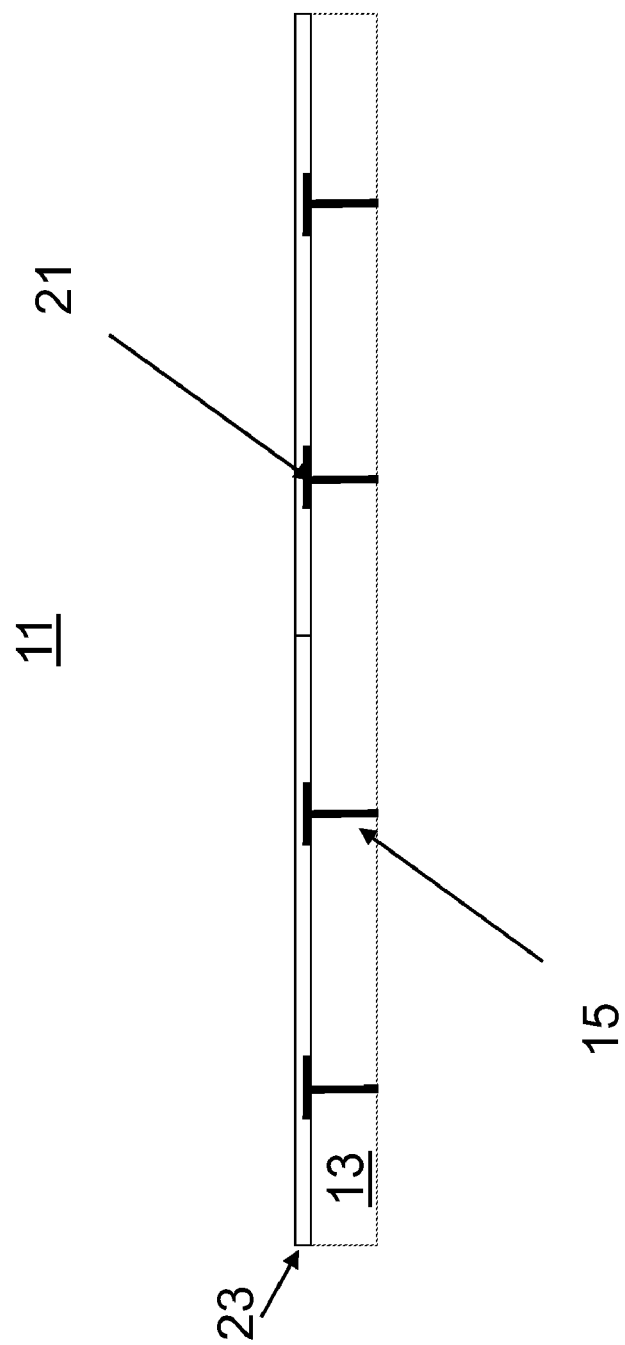
FIG. 2 depicts in a cross-section a substrate for use with the embodiments.

FIG. 2 depicts in a cross-section a detailed view of an example substrate 11 including TSVs that may be used with the method embodiments. Substrate 11 may be formed, for example, using a semiconductor wafer 13. TSVs 15 are provided to make vertical connections using via holes each filled with conductive material. In one example process, the TSVs are first formed as "blind vias" by an etch such as a reactive ion etch ("RIE") from the die side of the wafer 13, then a seed layer is deposited by sputtering into the blind vias; and then electroplating is used to fill the vias with a conductive material such as copper, for example. Later a wafer thinning is performed using chemical-mechanical polishing ("CMP") step on the bottom side of the wafer 13. The CMP wafer thinning is used to expose the bottom ends of the conductor filled vias and complete the TSVs 15 as shown. Conductive lands or pads 21 are shown formed on the upper surface of substrate 11 and are positioned in alignment to receive the microbumps (not shown) of a flip chip integrated circuit to be placed on the substrate in a later step. A passivation layer 23 may be formed of a dielectric such as an oxide or nitride to cover the upper surface of the substrate. When the flip chip bonding is performed, openings will be made in this dielectric layer to expose the lands 21, and the microbumps will be disposed on the lands.

Figure 3:
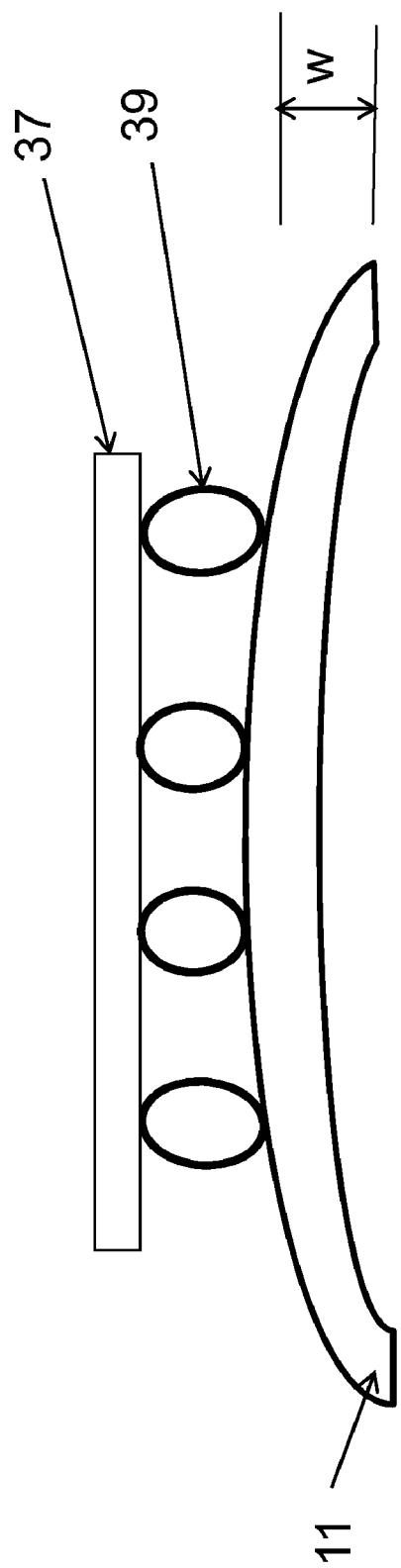
FIG. 3 depicts in a cross-section a substrate and package assembly at an intermediate step of a method embodiment.

In FIG. 3, a cross-section of a substrate 11 and an integrated circuit 37 is shown to illustrate a first intermediate process step of a method embodiment. The substrate 11 may include TSVs as in FIG. 2, or not; and may be of any of the materials described above. Integrated circuit 37 is shown flip chip mounted to substrate 11 using microbumps 39. In this example, the distance "w" illustrates the warp of the substrate. In FIG. 3, and the subsequent figures below, the substrate warp is shown in an exaggerated fashion for illustration and explanation of the embodiments. As can be seen, this warp causes non-uniform shapes in the microbumps 39. The microbumps are non-uniform in shape, and in this example are particularly elongated at the corners of the integrated circuit die 37 because the substrate 11 is warped. As the warp "w" increases the non-uniformity of the microbumps also increases, and as can be seen this is undesirable. Reduction and control of the warpage "w" is therefore desired.

Figure 4:
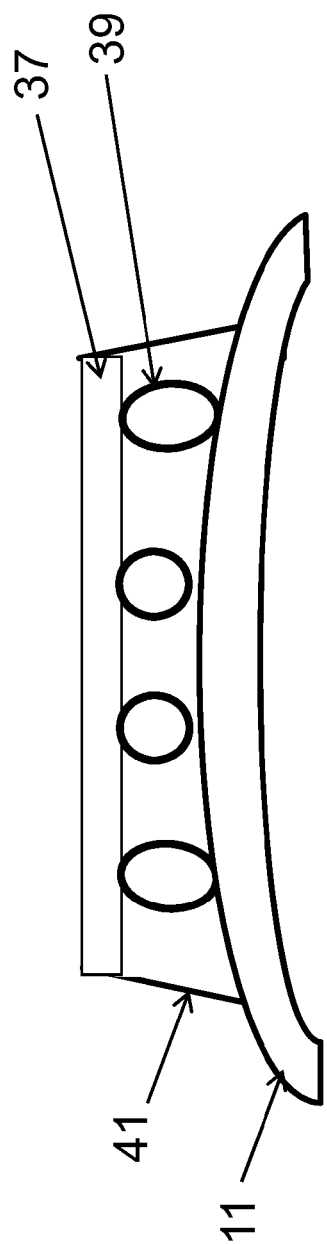
FIG. 4 depicts in a cross-section the package assembly of FIG. 3 following additional processing of a method embodiment.

FIG. 4 illustrates in a cross-section the substrate 11 of FIG. 3 after the underfill is dispensed in an additional process step. Now underfill material 41 is shown positioned between the integrated circuit die 37 and the substrate 11. The underfill material may be a high Tg underfill, with a Tg greater than 140 degrees C., for example. Even higher Tg materials may be used, such as Tg greater than 150 degrees C. Other underfills with lower Tg values may be used. In contrast to the conventional processes, in this method embodiment, no underfill cure is done at this time. In contrast to the known approaches, the underfill material 41 is dispensed and left uncured, removing a thermal process step that is used in the conventional approach, and reducing the process time over the conventional approach. Importantly, eliminating the underfill cure also reduces the substrate warp, as the thermal cycling of the substrate that therefore occurs in the conventional process is avoided.

Figure 5:
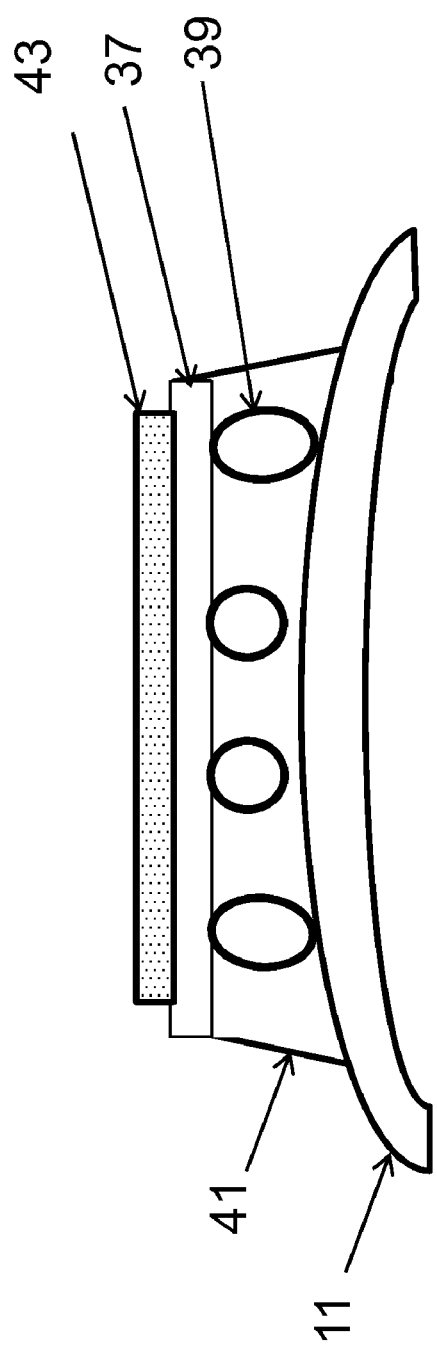
FIG. 5 depicts in a cross-section the package assembly of FIG. 4 following additional processing of a method embodiment.

In FIG. 5, a cross-section of the substrate 11 of FIG. 4 is shown, following additional process steps of an example method embodiment. The substrate 11 is shown, with integrated circuit die 37 mounted face down over the substrate and underfill 41 surrounding the microbumps 39 as before. A thermal interface material ("TIM") 43 is shown dispensed on the upper side of integrated circuit 37, providing a thermally conductive material. An example TIM material is so called "thermal grease" or "white grease". Other TIM materials for semiconductor packages may be used as well. The TIM material 43 is thermally conductive but is an electrical insulator, so that it does not create undesired shorts. No cure is performed at this stage in the method. As a result, both the underfill 41 and the TIM material 43 are now left uncured. The TIM material and the underfill material should therefore be selected with some care so that in their uncured states, they do not react with one another inappropriately and cause undesirable effects. Thus the apparatus of FIG. 5 shows an embodiment where both the underfill and the TIM materials are in an uncured state.

Figure 6:
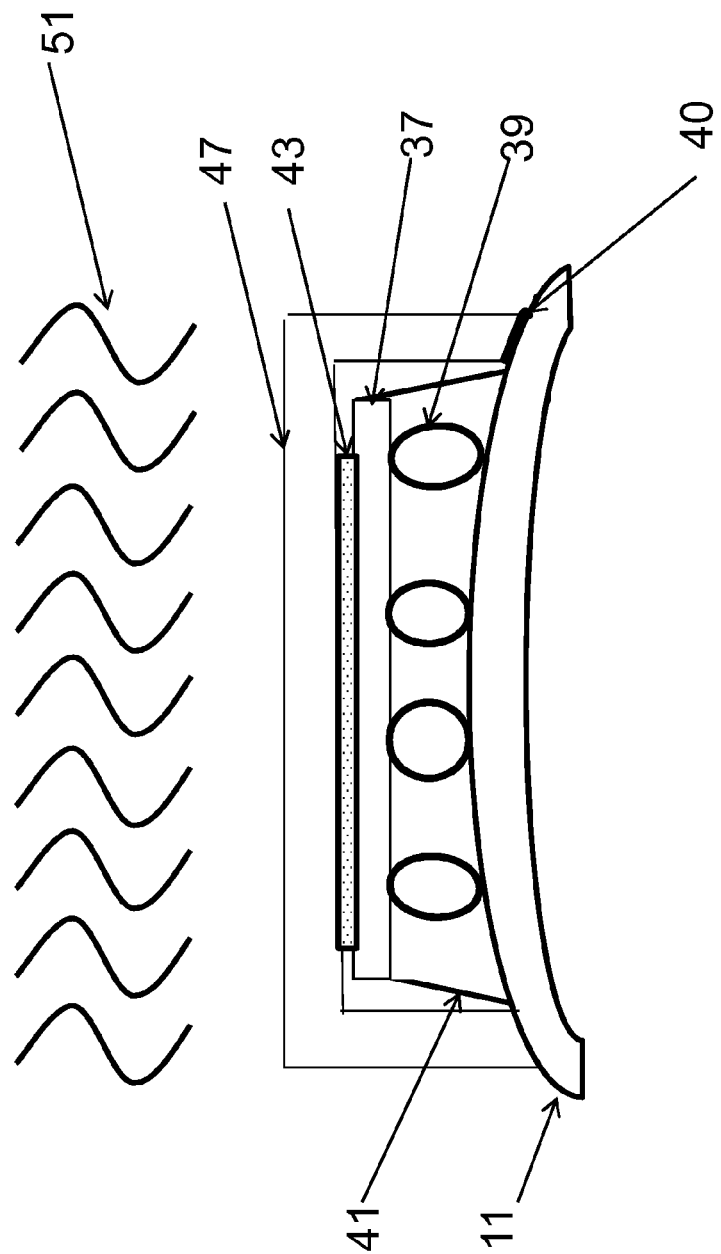
FIG. 6 depicts in a cross-section the package assembly of FIG. 5 following additional processing of a method embodiment.

In FIG. 6, the substrate 11 of FIG. 5 is depicted in a cross-section following additional process steps of the example method embodiment. A thermally conductive heat sink 47 is mounted to the integrated circuit 37 and is in physical contact with TIM 43. An adhesive may be provided to secure the heat sink 47 to the substrate 11 at areas such as 40, for example. In an alternative method embodiment, this adhesive may also be a material that is subject to a thermal cure.

In FIG. 6, lines 51 illustrate a thermal cure cycle. Thermal heating is used to simultaneously cure the TIM 43, the underfill 41, and in some embodiment, any thermal cure adhesive that is provided, for example at area 40 to secure the heat sink 47 to the substrate 11. As a single, simultaneous cure is used to cure at least the underfill 41, and the TIM 43, the warpage of the substrate due to thermal cycling is reduced substantially over the conventional approaches. In one example method, this thermal cure may be performed at about 150 degrees Celsius for 30 minutes, for example; although the method embodiments are not limited to any particular time or temperature. The cure temperature and time should be selected to cure both the underfill 41 and TIM 43, and if a thermal curing adhesive is used at 40, the adhesive. The time and temperature are determined by the materials chosen and the embodiments are not limited. Various thermal sources may be used, including, without limitation, radiant heat in a conventional oven, rapid thermal anneal (RTA) equipment, halogen lamps, forced air, convection heating, infrared or other heat sources.

Figure 7:
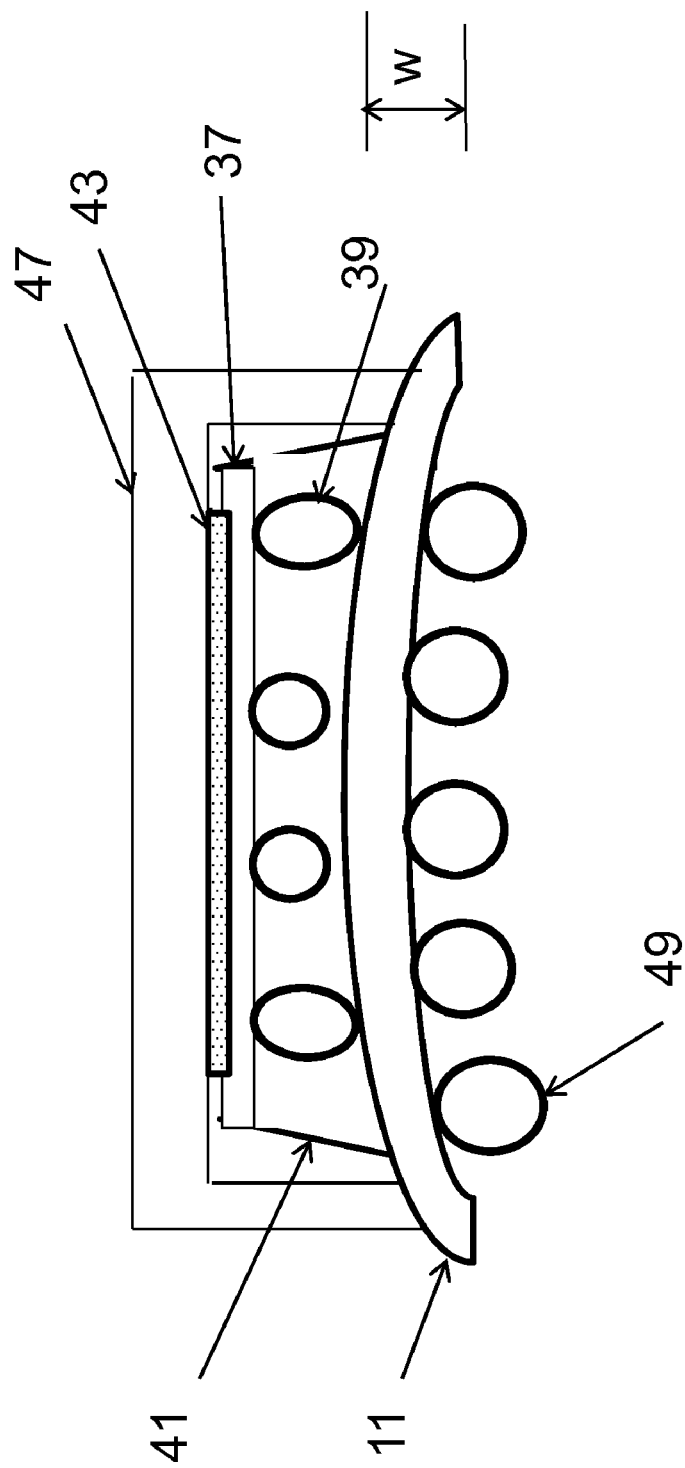
FIG. 7 depicts in a cross-section the package assembly of FIG. 6 following additional processing of a method embodiment.

FIG. 7 depicts in a cross-section the substrate 11 after additional process steps of the example method embodiment are performed. Following the thermal cure of FIG. 6, solder connectors 49 are disposed on the board side, or bottom side in this view, of substrate 11. These connectors 49 may be solder balls, solder columns such a controlled collapse column connectors ("C4" connectors), studs, or other connectors. Note that after mounting to a circuit board the connectors will not be "ball" shaped as the solder reflow process used to mount the substrate 11 to the system board will change the connector shape. Again the solder balls 49 are but one non-limiting example; other connectors including solder columns, C4 connectors, stud bumps, and the like may be used instead. Solder used may include lead based and lead free eutectic materials used for semiconductor packaging. If the substrate 11 includes TSVs, then some of the solder connectors 49 may be electrically coupled through the TSVs to the microbumps 39 and then couple to the integrated circuit 37; thus completing an electrical connection.

Figure 8:
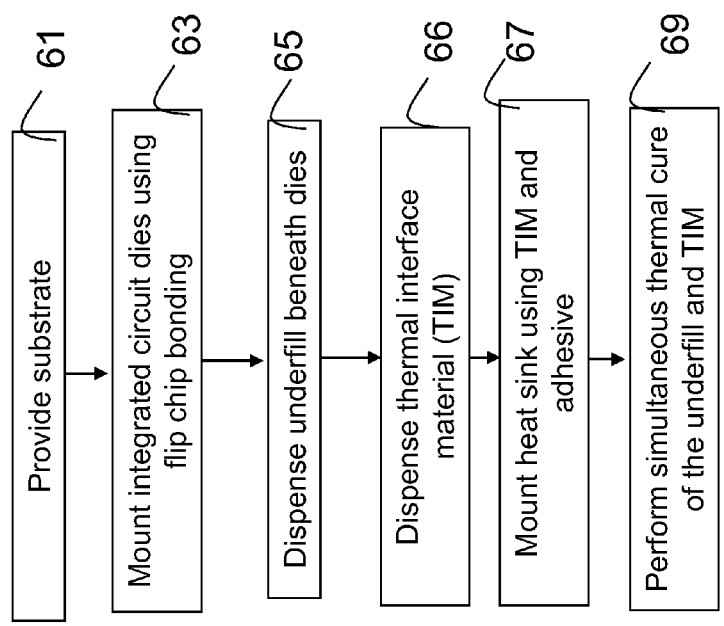
FIG. 8 depicts in a flow diagram a method embodiment.

FIG. 8 depicts, in a flow chart diagram, the steps used in an example method embodiment. In FIG. 8, the method begins at step 61. At 61, the substrate is provided. At step 63, one or more integrated circuit dies is flip chip bonded to the die side of the substrate. In step 65, the underfill material is dispensed or otherwise provided underneath the integrated circuit dies. However, the underfill is left uncured. In step 66 a thermal interface material (TIM) is provided on the back surface of the integrated circuit dies. In step 67 the heat sink is mounted to the thermal interface material (TIM) and to the substrate using adhesive. Finally, in step 69, the underfill and the TIM material are simultaneously cured in a single thermal cycle. Additional steps including mounting solder balls on the board side of the substrate, and mounting the completed package to a system board may then be performed.

In a measurement, substrate packages formed using the conventional approach were observed to exhibit a warp of greater than 5.7 mils for integrated circuit dies of 27×26 square mils mounted on a substrate. In a package formed for the same integrated circuit dies using the method embodiments described above, the warp observed was about 4.05 mils, and substantially less than 5 mils. Thus the use of the embodiments greatly reduced the warpage. Further, the embodiments eliminate processing steps and decrease processing time over the conventional approaches, thus lowering costs.

In an embodiment, a method provides a substrate having a die side and an opposite board side. One or more dies are flip chip mounted on the die side of the substrate. Underfill material is provided between the dies and the substrate. A thermal interface material is disposed on an upper surface of the dies; and a heat sink is mounted over and in thermal contact with the integrated circuit dies. The method then simultaneously cures the underfill material and the thermal interface material by a thermal cure.

In another embodiment, a method provides a semiconductor substrate. Blind vias are formed at predetermined locations into the semiconductor substrate from a die side of the semiconductor substrate. The blind vias are filled with a conductive material to form conductive vias. The method continues by backgrinding the substrate on a board side of the substrate opposite the die side of the substrate to expose a bottom end of the blind vias; thereby forming through substrate vias. At least one integrated circuit die is a flip chip mounted on the die side of the substrate. Underfill material is provided beneath the at least one integrated circuit die and between the at least one integrated circuit die and the substrate. A thermal interface material is disposed on an upper surface of dies; and a heat sink is mounted over the integrated circuit die, the heat sink having a surface in thermal contact with the thermal interface material. The heat sink is mounted to the surface of the substrate by an adhesive. The method continues by simultaneously curing the underfill material and the thermal interface material by a thermal cure.

In another embodiment, an apparatus includes a substrate having a die side and a board side. At least one integrated circuit die is flip chip mounted to the die side of the substrate. An uncured underfill material is disposed beneath the at least one integrated circuit die. An uncured thermal interface material disposed on a back side surface of the at least one integrated circuit die; and a heat sink disposed over the at least one integrated circuit die. The heat sink is in contact with the uncured thermal interface material.

The scope of the present application is not intended to be limited to the particular illustrative embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A method, comprising:
   providing a substrate having a die side and an opposite board side;
   flip chip mounting at least one integrated circuit die on the die side of the substrate;
   providing underfill material between the at least one integrated circuit die and the substrate;
   providing a thermal interface material on an upper surface of the at least one integrated circuit die;
   mounting a heat sink over the integrated circuit die, the heat sink having a surface in thermal contact with the thermal interface material; and
   simultaneously curing the underfill material and the thermal interface material by a thermal cure.

2. The method of claim 1, wherein the underfill material has a glass transition temperature Tg greater than 140 degrees Celsius.

3. The method of claim 1, wherein a warp of the substrate following the thermal cure is less than 5 mils.

4. The method of claim 1, wherein flip chip mounting the at least one integrated circuit die on the substrate further comprises:
   disposing solder connectors at predetermined positions on the die side of the substrate;
   positioning the at least one integrated circuit die above the substrate so that bond pads on the at least one integrated circuit die align with the solder connectors; and
   mounting the integrated circuit die on the substrate by placing the bond pads in physical contact with the solder connectors, and performing a thermal reflow step to bond the solder connectors to the bond pads of the at least one integrated circuit die and to the substrate.

5. The method of claim 4, wherein the solder connectors are lead based solder.

6. The method of claim 4, wherein the solder connectors are lead free solder.

7. The method of claim 4, wherein the solder connectors are microbumps.

8. The method of claim 1, further comprising mounting solder connectors on the board side of the substrate to from a ball grid array package.

9. The method of claim 8, wherein the solder connectors are solder balls.

10. A method, comprising:
    providing a semiconductor substrate;
    forming blind vias at predetermined locations into the semiconductor substrate from a die side of the semiconductor substrate;
    filling the blind vias with a conductive material to form conductive vias;
    backgrinding the substrate on a board side of the substrate opposite the die side of the substrate to expose a bottom end of the blind vias thereby forming through substrate vias;
    flip chip mounting at least one integrated circuit die on the die side of the substrate;
    providing underfill material beneath the at least one integrated circuit die and between the at least one integrated circuit die and the substrate;
    providing a thermal interface material on an upper surface of the at least one integrated circuit die;
    mounting a heat sink over the integrated circuit die, the heat sink having a surface in thermal contact with the thermal interface material and having portions mounted to the surface of the substrate by an adhesive; and
    simultaneously curing the underfill material and the thermal interface material by a thermal cure.

11. The method of claim 10, wherein the adhesive is simultaneously cured by the thermal cure of the underfill material and the thermal interface material.

12. The method of claim 10, wherein providing the underfill material further comprises dispensing a liquid epoxy underfill by capillary action.

13. The method of claim 12, wherein the liquid epoxy underfill has a glass transition temperature Tg of greater than 140 degrees Celsius.

14. The method of claim 10, wherein following the simultaneous curing, the substrate exhibits a warp of less than 5 mils.

15. The method of claim 10, wherein flip chip mounting the at least one integrated circuit die further comprises:
    providing microbumps formed of lead free solder material at predetermined positions on the die side of the substrate;
    placing the at least one integrated circuit on the microbumps; and
    performing a thermal reflow of the microbumps to form a physical and electrical connection between the at least one integrated circuit die and the substrate.

* * * * *